(12) United States Patent
Song et al.

(10) Patent No.: US 7,829,932 B2
(45) Date of Patent: Nov. 9, 2010

(54) SEMICONDUCTOR DEVICE

(75) Inventors: Seung-hwan Song, Incheon (KR);
Suk-pil Kim, Yongin-si (KR);
Yoon-dong Park, Yongin-si (KR);
Won-joo Kim, Hwaseong-si (KR);
June-mo Koo, Seoul (KR); Kyoung-Iae Cho, Yongin-si (KR); Jae-woong Hyun, Uijeongbu-si (KR); Sung-jae Byun, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 360 days.

(21) Appl. No.: 11/980,632

(22) Filed: Oct. 31, 2007

(65) Prior Publication Data

US 2008/0157182 A1 Jul. 3, 2008

(30) Foreign Application Priority Data

Dec. 27, 2006 (KR) ............... 10-2006-0135005

(51) Int. Cl.
*H01L 29/788* (2006.01)

(52) U.S. Cl. ............... 257/315; 257/E21.442; 257/E29.274

(58) Field of Classification Search ............ 257/314, 257/315, E21.442, E29.274
See application file for complete search history.

(56) References Cited

U.S. PATENT DOCUMENTS

| 6,458,662 | B1  | 10/2002 | Yu |
| 6,706,571 | B1  | 3/2004  | Yu et al. |
| 6,914,277 | B1  | 7/2005  | Hill et al. |
| 7,298,004 | B2* | 11/2007 | Specht et al. ............ 257/315 |
| 2005/0226075 | A1 | 10/2005 | Matsuzawa |
| 2005/0266638 | A1 | 12/2005 | Cho et al. |
| 2006/0073647 | A1* | 4/2006 | Inaba ................ 438/157 |
| 2006/0091433 | A1 | 5/2006 | Nishinohara |
| 2006/0115978 | A1 | 6/2006 | Specht et al. |
| 2006/0180854 | A1 | 8/2006 | Hsu et al. |
| 2006/0261414 | A1 | 11/2006 | Hovis et al. |
| 2006/0292781 | A1* | 12/2006 | Lee ................ 438/197 |
| 2007/0001219 | A1 | 1/2007 | Radosavljevic et al. |

(Continued)

FOREIGN PATENT DOCUMENTS

EP     1585177 A1     10/2005

(Continued)

OTHER PUBLICATIONS

European Search Report dated May 26, 2010 in corresponding European Application No. 07150240.5.

*Primary Examiner*—Jerome Jackson, Jr.
*Assistant Examiner*—Paul A Budd
(74) *Attorney, Agent, or Firm*—Harness, Dickey & Pierce, P.L.C.

(57) ABSTRACT

Example embodiments relate to a semiconductor device including a fin-type channel region and a method of fabricating the same. The semiconductor device includes a semiconductor substrate, a semiconductor pillar and a contact plug. The semiconductor substrate includes at least one pair of fins used (or functioning) as an active region. The semiconductor pillar may be interposed between portions of the fins to connect the fins. The contact plug may be disposed (or formed) on the semiconductor pillar and electrically connected to top surfaces of the fins.

6 Claims, 5 Drawing Sheets

U.S. PATENT DOCUMENTS

| | | |
|---|---|---|
| 2007/0004117 A1* | 1/2007 | Yagishita .................... 438/197 |
| 2007/0010059 A1 | 1/2007 | Hovis et al. |
| 2007/0019479 A1* | 1/2007 | Kim et al. .............. 365/189.05 |
| 2007/0141781 A1* | 6/2007 | Park et al. .................... 438/257 |
| 2007/0172770 A1* | 7/2007 | Witters et al. ............... 430/313 |
| 2008/0111199 A1 | 5/2008 | Kim et al. |
| 2008/0251849 A1 | 10/2008 | Yamagami et al. |
| 2008/0258207 A1 | 10/2008 | Radosavljevic et al. |
| 2008/0265308 A1 | 10/2008 | Lee |
| 2008/0303079 A1 | 12/2008 | Cho et al. |
| 2009/0253255 A1 | 10/2009 | Kim et al. |

FOREIGN PATENT DOCUMENTS

| | | |
|---|---|---|
| EP | 1923908 | 5/2008 |
| KR | 10-0645065 | 11/2006 |
| WO | WO 2005/091374 A1 | 9/2005 |
| WO | WO 2006/122956 A1 | 11/2006 |
| WO | WO 2007/005697 A2 | 1/2007 |

* cited by examiner

SEMICONDUCTOR DEVICE

PRIORITY STATEMENT

This application claims the benefit of priority under 35 U.S.C. §119 from Korean Patent Application No. 10-2006-0135005, filed on Dec. 27, 2006, in the Korean Intellectual Property Office, the disclosure of which is incorporated herein in its entirety by reference.

BACKGROUND

1. Field

Example embodiments relate to a semiconductor device and method of fabrication the same. Other example embodiments relate to a semiconductor device including a fin-type channel region and a method of fabricating the same.

2. Description of the Related Art

Semiconductor products have been increasingly scaled down and manufactured to process increasing amounts of data. Thus, laborious research has been conducted on methods of increasing the operating speed and/or integration density of semiconductor devices used in semiconductor products. For example, a highly integrated semiconductor device, which uses a fin field effect transistor (FinFET) or a fin memory cell, may increase the area of a channel in order to increase an operating speed of the semiconductor device and/or decrease a width of the fin in order to increase an integration density of the semiconductor device.

The conventional art acknowledges a FinFET and a fin memory cell. The conventional art also acknowledges a Fin-FET using a silicon-on-insulator (SOI) substrate.

The conventional FinFET and fin memory cells may have problems associated with the stability of thin fin structures. It may be difficult to form uniform contact plugs in the fin structures. It may be difficult to decrease a contact resistance between the thin fin structures and the contact plugs.

SUMMARY

Example embodiments relate to a semiconductor device and method of fabrication the same. Other example embodiments relate to a semiconductor device including a fin-type channel region and a method of fabricating the same.

Example embodiments relate a semiconductor device that may increase the stability of a fin structure and/or the reliability of a contact plug and a method of fabricating the same.

According to example embodiments, there is provided a semiconductor device including a semiconductor substrate, a semiconductor pillar and a contact plug. The semiconductor substrate includes at least one pair of fins used (or functioning) as an active region. The semiconductor pillar may be interposed (or formed) between portions of the fins to connect the fins. The contact plug may be disposed (or formed) on the semiconductor pillar. The contact plug may electrically connect to top surfaces of the fins.

The fins and the semiconductor pillar may be formed of the same semiconductor material. The semiconductor substrate may include a bulk semiconductor wafer. The fins and the semiconductor pillar may be formed by etching the bulk semiconductor wafer.

According to example embodiments, the semiconductor device may include a buried insulating layer interposed (or formed) between the fins and the semiconductor pillar.

According to example embodiments, the semiconductor device may include a bridge insulating layer for connecting top ends of the fins to define a void between the fins and the semiconductor pillar.

The semiconductor device may include a gate electrode extending (or formed) across the buried insulating layer and/or covering (or formed on) portions of outer surfaces of the fins on an opposite side of the fins than the buried insulating layer. A gate insulating layer may be interposed (or formed) between the outer surfaces of the fins and the gate electrode.

According to example embodiments, there is provided a method of fabricating a semiconductor device. The method includes forming a device isolation layer on a semiconductor substrate to define an active region. The active region may be etched to form at least one pair of fins and a semiconductor pillar such that the semiconductor pillar is interposed between portions of the fins in order to connect the fins. A contact plug may be formed on the semiconductor pillar such that the contact plug is electrically connected to top surfaces of the fins.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein.

DETAILED DESCRIPTION OF EXAMPLE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a semiconductor device and method of fabrication the same. Other example embodiments relate to a semiconductor device including a fin-type channel region and a method of fabricating the same.

FIGS. 1 through 5 are diagrams illustrating perspective views of a semiconductor device and a method of fabricating the same according to example embodiments. The semiconductor device according to example embodiments may be referred to as a fin field effect transistor (Fin-FET). However, example embodiments are not limited thereto.

Figure 5:
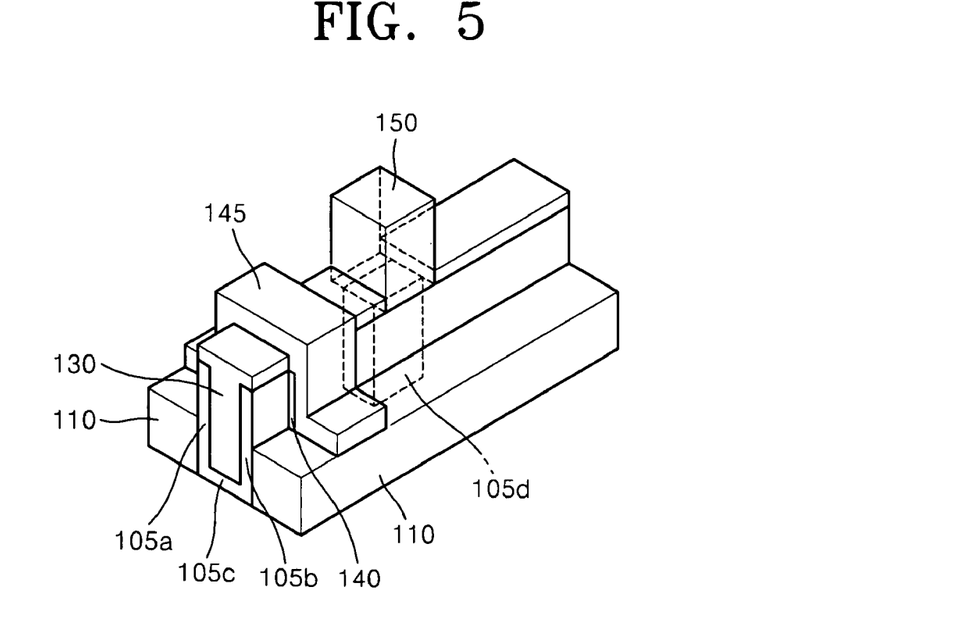

Referring to FIG. 5, the semiconductor device may be formed with a semiconductor substrate (not shown) including a pair of fins 105a and 105b. The fins 105a and 105b may be used (or function) as an active region. The active region may be defined by a device isolation layer 110. The semiconductor substrate may include a body 105c for connecting the bottom ends of the fins 105a and 105b.

A semiconductor pillar 105d may be interposed between the fins 105a and 105b to connect portions of the fins 105a and 105b. The semiconductor pillar 105d may be used to fix and/or support the fins 105a and 105b. If the fins 105a and 105b are formed of a thin layer, the fins 105a and 105b may be stabilized on the body 105c due to the semiconductor pillar 105d. A reduction in the widths of the fins 105a and 105b may increase the integration density of the semiconductor device.

The fins 105a and 105b, the semiconductor pillar 105d and the body 105c may be formed of the same semiconductor material. For example, a bulk semiconductor wafer may be etched to define the fins 105a and 105b, the semiconductor pillar 105d and/or the body 105c in the semiconductor substrate. The bulk semiconductor wafer may be a silicon wafer, a germanium wafer or a silicon-germanium wafer.

According to example embodiments, any two (or all) of the fins 105a and 105b, the semiconductor pillar 105d and the body 105c may be formed of different semiconductor materials. According to example embodiments, the body 105c may be formed of a single-crystalline wafer and the fins 105a and 105c and the semiconductor pillar 105d may be formed of a semiconductor epitaxial layer.

A contact plug 150 may be disposed (or formed) on the semiconductor pillar 105d. The contact plug 150 may be electrically connected to the top ends of the fins 105a and 105b. If the fins 105a and 105b are thin, it may be difficult to form the contact plug 150 directly on the top surfaces of the fins 105a and 105b. Because the semiconductor pillar 105d is interposed between the fins 105a and 105b, the contact plug 150 may be more uniformly and stably formed on the top ends of the fins 105a and 105b.

Because the contact plug 150 may be aligned with the top surfaces of the fins 105a and 105b, the contact plug 150 may not penetrate between the fins 105a and 105b. Because the contact plug 150 may be aligned with the top surfaces of the fins 105a and 105b, the contact plug 150 may not damage the fins 105a and 105b. If the contact plug 150 is in contact with lateral surfaces of the fins 105a and 105b, the fins 105a and 105b may be damaged by the contact plug 150.

If a metal silicide layer or a metal salicide layer (not shown) is formed on the semiconductor pillar 105d and the fins 105a and 105b, a contact resistance between the contact plug 150 and the fins 105a and 105b may decrease. The process of forming a metal silicide layer or a metal salicide layer on the top ends of the thin fins 105a and 105b without the semiconductor pillar 105d may be difficult. The formation of a metal salicide layer involves wet etching an unreacted metal. It may be difficult to perform a selective wet etching process between the thin fins 105a and 105b.

At least one MOS transistor may be selectively formed using the fins 105a and 105b as a channel region. For example, a buried insulating layer 130 may be interposed (or formed) between the fins 105a and 105b and the semiconductor pillar 105d. The outer lateral surfaces of the fins 105a and 105b on the opposite side to the buried insulating layer 130 may function as a channel region. Because lower portions of the outer surfaces of the fins 105a and 105b may be covered with the device isolation layer 110, the upper portions of the outer surfaces of the fins 105a and 105b may be used as the channel region. According to other example embodiments, only the upper portions of the outer surfaces of the fins 105a and 105b may be used as the channel region.

A gate electrode 145 may extend across the buried insulating layer 130. The gate electrode 145 may cover at least the upper portions of the outer surfaces of the fins 105a and 105b. Gate insulating layers 140 may be interposed (or formed) between the gate electrode 145 and the outer surfaces of the fins 105a and 105b. According to example embodiments, the gate insulating layers 140 may be connected to one another across the fins 105a and 105b.

In the MOS transistor according to example embodiments, the contact plug 150 may be connected to a common source and/or drain electrode. The contact plug 150 may be connected to common source or drain regions (not shown) of the fins 105a and 105b. The number of semiconductor pillars 105d and contact plugs 150 is not limited to the above example embodiments. The number of semiconductor pillars 105d and contact plugs 150 may be selected according to the type of a semiconductor device. The MOS transistor may be used to increase the area of a channel region and/or an operating current. The MOS transistor may be used to form an inverter having a common source or drain electrode.

So far, example embodiments have been described with reference to a pair of fins 105a and 105b. However, example embodiments are not limited thereto. A plurality of fins may be disposed (or formed) and semiconductor pillars may be interposed between two of the fins.

Hereinafter, a method of fabricating the semiconductor device according example embodiments will be described with reference to FIGS. 1 through 5.

Figure 1:
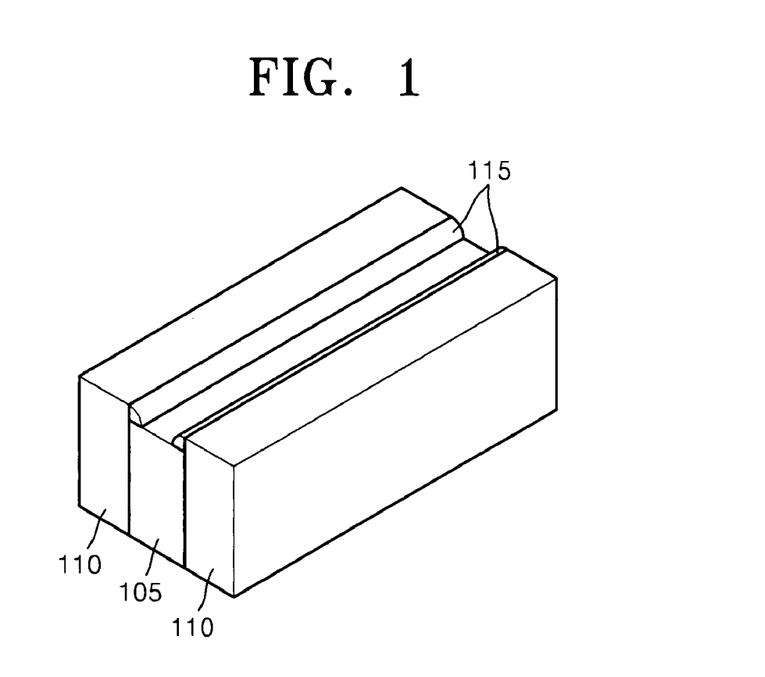
FIGS. 1 through 5 are diagrams illustrating perspective views of a semiconductor device and a method of fabricating the same according to example embodiments.

Referring to FIG. 1, a semiconductor substrate is provided. The semiconductor substrate may include an active region 105 defined by device isolation layers 110. The semiconductor substrate may extend under the active region 105. The semiconductor substrate may support the device isolation layers 110. The device isolation layers 110 may be formed by etching a bulk semiconductor wafer so that the active region 105 may be defined between the device isolation layers 110. The device isolation layers 110 may be formed using an oxide layer.

According to example embodiments, the active region 105 may be formed of a semiconductor epitaxial layer. The semiconductor substrate may include a single-crystalline bulk semiconductor wafer (not shown) disposed under the active region 105.

A pair of spacer insulating layers 115 may be formed on the sidewalls at the top ends of the device isolation layers 110. The spacer insulating layers 115 may be formed to cover (or over) both edges of the active region 105. The spacer insulating layers 115 may be formed using a nitride layer.

Figure 2:
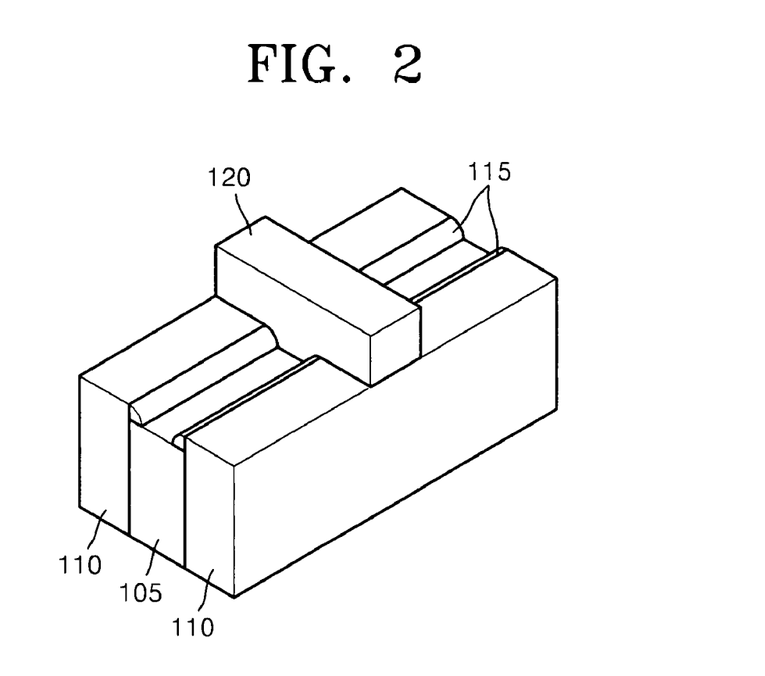

Referring to FIG. 2, a mask layer 120 may be formed covering (or over) a portion of the active region 105. The mask layer 120 may be formed intersecting the spacer insulating layers 115. The mask layer 120 may be formed using a photoresist layer, an oxide layer or a nitride layer.

Figure 3:
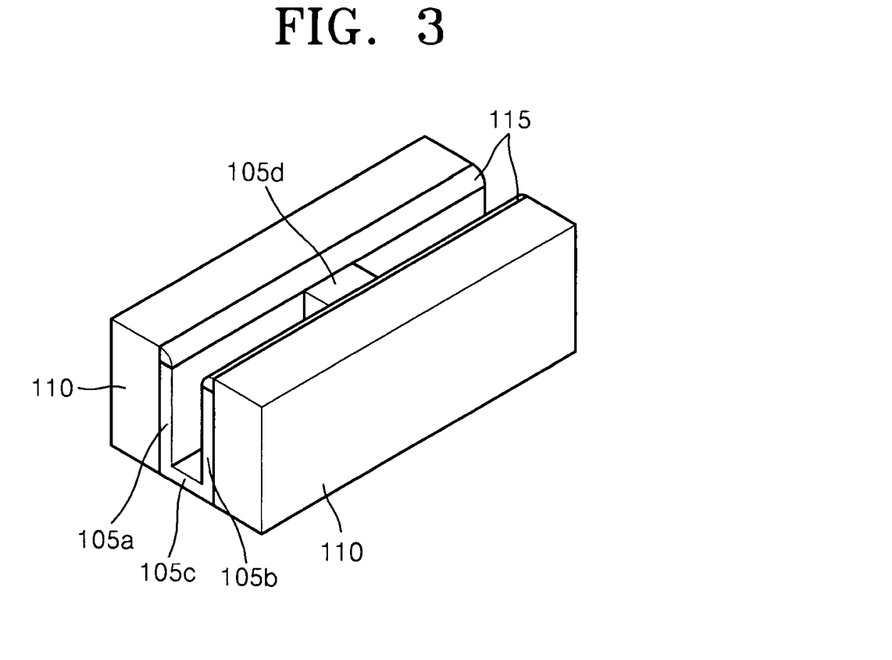

Referring to FIG. 3, an exposed portion of the active region 105 may be etched using the spacer insulating layers 115 and the mask layer 120 as etch protection layers. A pair of fins 105a and 105b may be formed on a body 105c. A semiconductor pillar 105d may be formed on the fins 105a and 105b. The width of the fins 105a and 105b may be controlled by adjusting the width of the spacer insulating layers 115. The body 105c may connect the bottom ends of the fins 105a and 105b to each other. For example, the body 105c may be the remaining portion of the semiconductor substrate (except the fins 105a and 105b and the semiconductor pillar 105d).

The semiconductor pillar 105d may correspond to a portion of the active region 105 disposed (or formed) under the mask layer 120. The semiconductor pillar 105d may be disposed (or formed) on a portion of the active region 105 between the fins 105a and 105b to connect the fins 105a and 105b. According to example embodiments, the fins 105a and 105b, the semiconductor pillar 105d and the body 105c may be formed by etching the same semiconductor material. According to other example embodiments, the fins 105a and 105b, the semiconductor pillar 105d and the body 105c may be formed of different semiconductor materials.

The fins 105a and 105b and the semiconductor pillar 105d may be formed simultaneously by etching the active region 105 using an appropriate mask layer (not shown). If the fins 105a and 105b have a small width, it may be difficult to form the mask layer.

Figure 4:
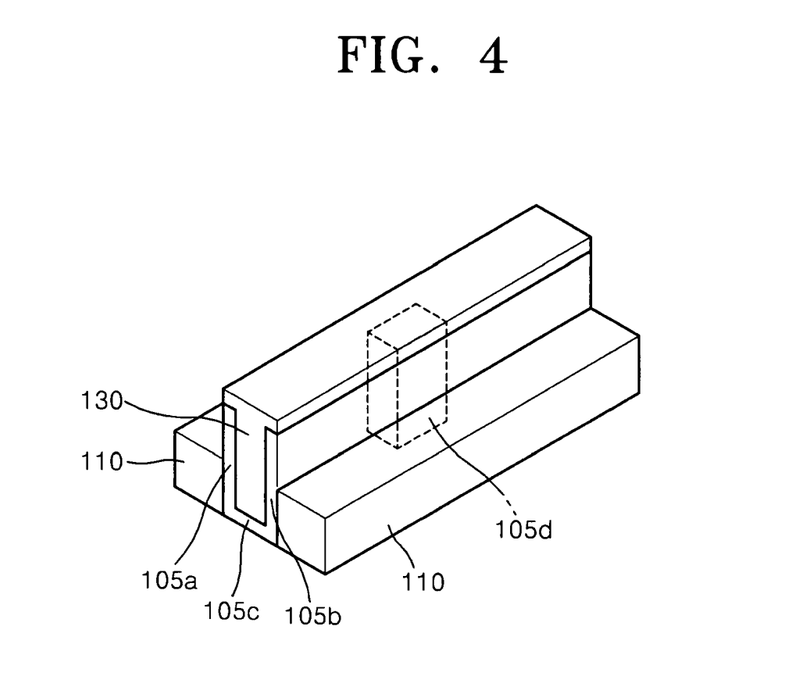

Referring to FIG. 4, the spacer insulating layers 115 may be removed. A buried insulating layer 130 may be formed between the fins 105a and 105b and the semiconductor pillar 105d. The buried insulating layer 130 may be obtained (or formed) by forming an insulating layer using a chemical vapor deposition (CVD) process and planarizing the insulating layer. The buried insulating layer 130 may be formed using a nitride layer.

The spacer insulating layers 115 may not be removed. The buried insulating layer 130 may be formed on the spacer insulating layers 115.

The device isolation layer 110 may be etched to a desired height using the buried insulating layer 130 as an etch protection layer. Upper portions of the outer surfaces of the fins 105a and 105b, which are disposed (or formed) on the opposite side of the fins 105a and 105b than the buried insulating layer 130, may be exposed.

Referring to FIG. 5, gate insulating layers 140 may be formed covering the upper portions of the outer surfaces of the fins 105a and 105b. The gate insulating layers 140 may be formed by oxidizing the exposed surfaces of the fins 105a and 105b. According to example embodiments, the gate insulating layers 140 may be formed using a CVD process. The gate insulating layers 140 may be connected to each another across the buried insulating layer 130.

A gate electrode 145 may extend across the buried insulating layer 130 and/or cover the gate insulating layers 140. The gate electrode 145 may be obtained (or formed) by forming a polysilicon layer, a metal layer or a metal silicide layer. A resulting layer may be patterned.

A portion of the buried insulating layer 130 may be etched, forming a contact hole (not shown) exposing portions of top surfaces of the fins 105a and 105b and a top surface of the semiconductor pillar 105d. A contact plug 150 may be formed such that the contact plug 150 is connected to the top surfaces of the fins 105a and 105b. The contact plug 150 may be mounted on the semiconductor pillar 105d. The contact plug 150 may be obtained (or formed) by forming a polysilicon layer, a metal layer or a metal silicide layer. A resulting layer may be patterned. The semiconductor device may be completed by processes known in the art.

Figure 6:
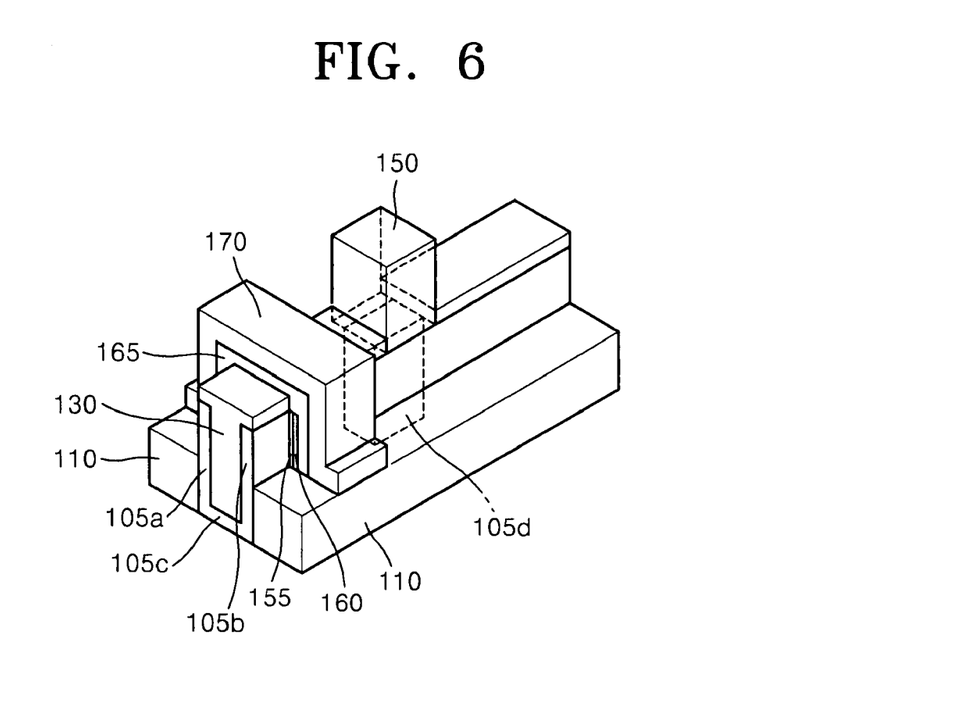
FIG. 6 is a diagram illustrating a perspective view of a semiconductor device and a method of fabricating the same according to example embodiments.

FIG. 6 is a diagram illustrating a perspective view of a semiconductor device and a method of fabricating the same according to example embodiments. The semiconductor device of FIG. 6 is may be formed according to the same method as the semiconductor device of FIG. 5 except that a MOS transistor is replaced by a memory transistor. Thus, a description of like components in FIGS. 5 and 6 will omitted for the sake of brevity.

Referring to FIG. 6, a memory transistor may include a pair of tunneling insulating layers 155, a pair of charge storage layers 160, a blocking insulating layer 165 and a control gate electrode 170. The blocking insulating layer 165 may be omitted depending on the type and structure of the charge storage layers 160. The memory transistor may be used as a cell for a nonvolatile memory device.

The tunneling insulating layers 155 may be formed covering (or over) upper portions of outer surfaces of the fins 105a and 105b. The tunneling insulating layers 155 may be disposed (or formed) on the opposite side of the fins 105a and 105b than the buried insulating layer 130. The control gate electrode 170 may extend across the buried insulating layer 130. The control gate electrode 170 may be formed on (or covering) the upper portions of the outer surfaces of the fins 105a and 105b. The charge storage layers 160 may be interposed (or formed) between the tunneling insulating layers 155 and the blocking insulating layer 165. The blocking insulating layer 165 may be interposed (or formed) between the control gate electrode 170 and the charge storage layers 160. The blocking insulating layer 165 may extend over (or across) the buried insulating layer 130.

According to example embodiments, the tunneling insulating layers 155 on either side may extend over (or across) the buried insulating layer 130 such that the tunneling insulating layers 155 are connected to one another. The charge storage layers 160 on either side may extend over (or across) the buried insulating layer 130 such that the charge storage layers 160 are connected to one another. The charge storage layers 160 may have partial charge storage capabilities.

The tunneling insulating layers 155 and the blocking insulating layer 165 may be formed using an oxide layer, a nitride layer or a high-k dielectric layer. The high-k dielectric layer may refer to an insulating layer having a higher dielectric constant than an oxide layer or a nitride layer. The charge storage layers 160 may be formed using a polysilicon layer, a nitride layer, quantum dots or nanocrystals. The quantum dots or nanocrystals may be formed of a metal or polysilicon. The nitride layer, the quantum dots or the nanocrystals may have partial charge storage capability.

According to example embodiments, the semiconductor device may be used as a nonvolatile memory device. The numbers and structures of the memory transistor and the contact plug 150 may be selected depending on the memory size and structure of the nonvolatile memory device. A plurality of fins 105a and 105b may be arranged. If the nonvolatile memory device is a NAND type, the contact plug 150 may be connected to a bit line (not shown). If the nonvolatile memory device is a NOR type, the contact plug 150 may be connected to a source or drain electrode (not shown).

Figure 7:
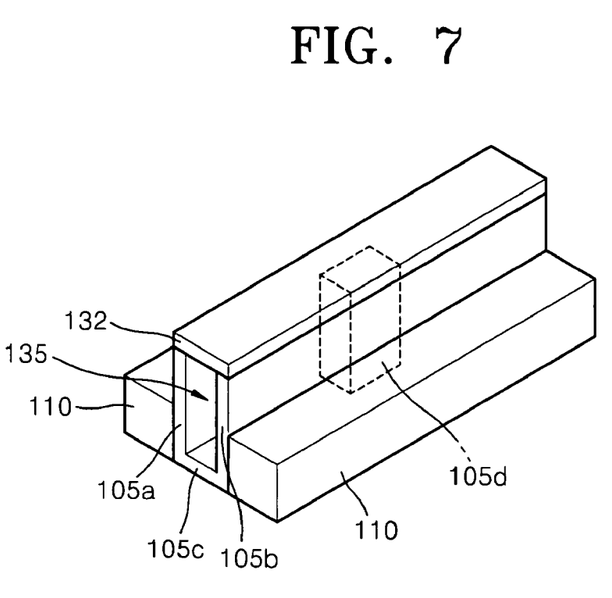
FIGS. 7 and 8 are diagrams illustrating perspective views of a semiconductor device and a method of fabricating the same according to example embodiments.
Figure 8:
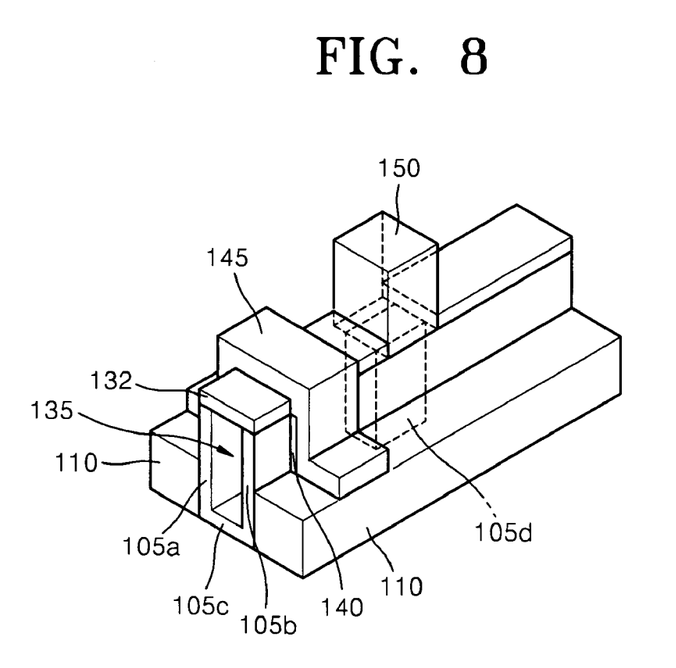

FIGS. 7 and 8 are diagrams illustrating perspective views of a semiconductor device and a method of fabricating the same according to example embodiments.

The semiconductor device of FIGS. 7 and 8 may be formed using the same method as the semiconductor device of FIG. 5 except that the buried insulating layer 130 of FIG. 5 is modified. Thus, a description of like components in FIGS. 5, 7 and 8 will omitted for the sake of brevity.

Referring to FIG. 8, a bridge insulating layer 132 may be used instead of the buried insulating layer 130 (refer to FIG. 5). The bridge insulating layer 132 may be formed on the top ends of the fins 105a and 105b to define a void 135 between the fins 105a and 105b. The volume of the void 135 may be controlled by adjusting the position of the bridge insulating layer 132. The bridge insulating layer 132 may extend down to upper regions of the fins 105a and 105b.

The void 135 may have a lower dielectric constant than any insulating material. The void 135 may effectively lower a dielectric constant between the fins 105a and 105b. Signal interference between the fins 105a and 105b may be suppressed. According to example embodiments, the semiconductor pillar 105d may define the void 135 in the lengthwise (or horizontal) direction of the fins 105a and 105b. The semiconductor pillar 105d may prevent a conductive layer (e.g., a metal layer or a polysilicon layer) from penetrating the void 135. As such, the reliability of the semiconductor device including the void 135 may increase.

A method of fabricating the semiconductor according to example embodiments may be performed in the same manner as the method of fabricating the semiconductor device as described above with reference to FIGS. 1 through 5. However, a process of forming the buried insulating layer 130 as described with reference to FIG. 4 may be used instead of a process of forming the bridge insulating layer 132 as described with reference to FIG. 7.

Referring to FIG. 7, after forming the fins 105a and 105b and the semiconductor pillar 105d, the bridge insulating layer 132 may be formed connecting top surfaces of the fins 105a and 105b. The void 135 may be defined among the fins 105a and 105b, the semiconductor pillar 105d and the bridge insulating layer 132.

Referring to FIG. 8, a MOS transistor and a contact plug 150 may be formed. The MOS transistor may be formed by forming the bridge insulating layer 132 instead of the buried insulating layer 130 during the process described with reference to FIG. 5.

Figure 9:
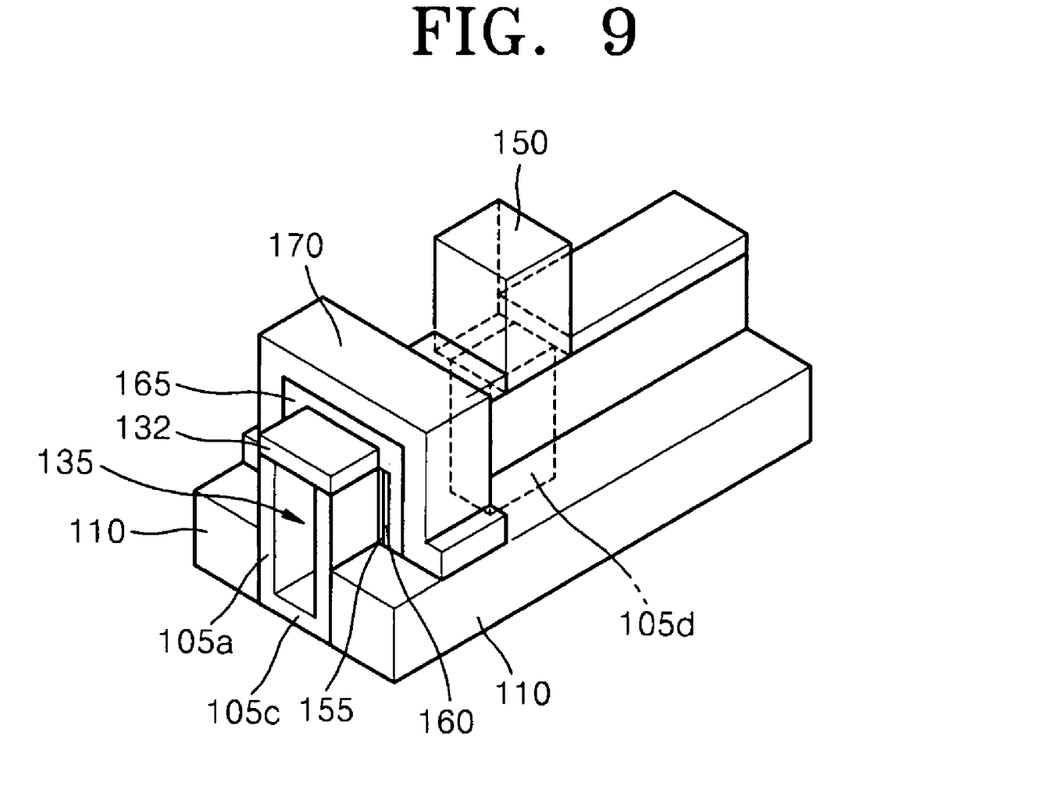
FIG. 9 is a diagram illustrating perspective view of a semiconductor device and a method of fabricating the same according to example embodiments.

FIG. 9 is a diagram illustrating perspective view of a semiconductor device and a method of fabricating the same according to example embodiments.

The semiconductor device of FIG. 9 may be formed by the same method as the semiconductor device of FIG. 6 except that the buried insulating layer 130 of FIG. 6 is modified. Thus, a description of like components in FIGS. 5 and 9 will be omitted for the sake of brevity.

Referring to FIG. 9, a bridge insulating layer 132 may be provided instead of the buried insulating layer 130 (refer to FIG. 6). The bridge insulating layer 132 may define a void 135 between the fins 105a and 105b and the semiconductor pillar 150 in the same manner as described in detail with reference to FIGS. 7 and 8. As stated above, the void 135 may decrease the interference between memory transistors formed using the fins 105a and 105b.

A method of fabricating the semiconductor according to example embodiments may be performed in the same manner as the method of fabricating the semiconductor device as described above with reference to FIGS. 1 through 4 and 6. However, a process of forming the buried insulating layer 130 as described with reference to FIG. 4 may be used instead of a process of forming the bridge insulating layer 132 as described with reference to FIG. 7.

Referring to FIG. 9, after forming the bridge insulating layer 132, a memory transistor and a contact plug 150 may be formed. The memory transistor may be formed by forming the bridge insulating layer 132 instead of the buried insulating layer 130 during the process described with reference to FIG. 6.

According to example embodiments as described above, a semiconductor device includes a semiconductor pillar interposed between fins such that a contact plug may be more uniformly and stably formed on the top ends of the fins.

Also, in the semiconductor device according to example embodiments, a metal silicide layer or a metal salicide layer may be formed on the surfaces of the semiconductor pillar and the fins, decreasing a contact resistance between the contact plug and the fins.

According to example embodiments, expansion of a void disposed (or formed) between the fins may decrease using the semiconductor pillar. As such, a conductive material may not penetrate the void, increasing the reliability of the semiconductor device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
    a semiconductor substrate including at least one pair of fins functioning as an active region;
    a semiconductor pillar between portions of the at least one pair of fins, wherein the semiconductor pillar connects the at least one pair of fins;
    a contact plug on the semiconductor pillar and electrically connected to top surfaces of the at least one pair of fins, and
    a bridge insulating layer connecting top ends of the at least one pair of fins, wherein the bridge insulating layer defines a void between the at least one pair of fins and the semiconductor pillar.

2. The device of claim 1, wherein the at least one pair of fins and the semiconductor pillar are formed of the same semiconductor material.

3. The device of claim 1, wherein the semiconductor substrate includes a bulk semiconductor wafer, and the at least one pair of fins and the semiconductor pillar are formed by etching the bulk semiconductor wafer.

4. The device of claim 1, further comprising a body connecting bottom ends of the at least one pair of fins.

5. The device of claim 1, further comprising:
    a gate electrode extending across the bridge insulating layer and covering portions of outer surfaces of the at least one pair of fins, wherein the outer surfaces of the at least one pair of fins are on a side surface of the at least one pair of fins and the bridge insulating layer is on an upper surface of the at least one pair of fins; and
    a pair of gate insulating layers between the outer surfaces of the fins and the gate electrode.

6. The device of claim 1, further comprising:
    a control gate electrode extending across the bridge insulating layer and covering portions of outer surfaces of the at least one pair of fins, wherein the outer surfaces of the at least one pair of fins are on a side surface of the at least one pair of fins and the bridge insulating layer is on an upper surface of the at least one pair of fins;
    a pair of charge storage layers between the outer surfaces of the fins and the control gate electrode; and
    a pair of tunneling insulating layers between the outer surfaces of the at least one pair of fins and the charge storage layers.

* * * * *